(12) United States Patent
Shibata

(10) Patent No.: US 10,470,351 B2
(45) Date of Patent: Nov. 5, 2019

(54) MOUNTING SYSTEM

(71) Applicant: FUJI CORPORATION, Chiryu-shi (JP)

(72) Inventor: Mitsuhiko Shibata, Toyota (JP)

(73) Assignee: FUJI CORPORATION, Chiryu-shi (JP)

( * ) Notice: Subject to any disclaimer, the term of this patent is extended or adjusted under 35 U.S.C. 154(b) by 169 days.

(21) Appl. No.: 15/735,775

(22) PCT Filed: Jun. 17, 2015

(86) PCT No.: PCT/JP2015/067448
§ 371 (c)(1),
(2) Date: Dec. 12, 2017

(87) PCT Pub. No.: WO2016/203571
PCT Pub. Date: Dec. 22, 2016

(65) Prior Publication Data
US 2018/0160577 A1    Jun. 7, 2018

(51) Int. Cl.
*H05K 13/08* (2006.01)
*H05K 13/00* (2006.01)
*H05K 13/04* (2006.01)

(52) U.S. Cl.
CPC ......... *H05K 13/08* (2013.01); *H05K 13/0015* (2013.01); *H05K 13/0408* (2013.01); *H05K 13/0465* (2013.01); *H05K 13/082* (2018.08); *H05K 2201/09918* (2013.01); *H05K 2203/163* (2013.01)

(58) Field of Classification Search
None
See application file for complete search history.

(56) References Cited

U.S. PATENT DOCUMENTS

| 5,926,030 A * | 7/1999 | Ito ..................... G01R 31/31903 |
| | | 324/757.04 |
| 7,502,656 B2 * | 3/2009 | Thibault .......... G05B 19/41835 |
| | | 700/83 |

FOREIGN PATENT DOCUMENTS

WO    WO 2014/155657 A1    10/2014

OTHER PUBLICATIONS

International Search Report dated Sep. 8, 2015, in PCT/JP2015/067448 filed Jun. 17, 2015.

* cited by examiner

*Primary Examiner* — Sean Shechtman
(74) *Attorney, Agent, or Firm* — Oblon, McClelland, Maier & Neustadt, L.L.P.

(57) ABSTRACT

In a mounting system including multiple mounting machines, there is provided a mounting system that is capable of reducing the number of measurement devices that measure electrical characteristics of an electronic component. A control device controls a switching device in order to connect a measurement device and a mounting machine that transmitted request information for measuring the electrical characteristics of the electronic component. When transmitting an instruction for starting measurement to the measurement device and receiving a characteristic measurement value from the measurement device, the control device transfers the received characteristic measurement value to the mounting machine that transmitted request information.

6 Claims, 11 Drawing Sheets

MOUNTING SYSTEM

TECHNICAL FIELD

The present disclosure relates to a mounting system that mounts electronic components on a circuit board, and more particularly to a mounting system having a measurement device that measures electrical characteristics of electronic components.

BACKGROUND ART

Conventionally, some electronic component mounting machines that mount electronic components on a circuit board are equipped with a measurement device that measures electrical characteristics of the electronic components (for example, PTL 1). This measurement device measures, for example, inductance, capacitance, and resistance as the electrical characteristics of an electronic component. The electronic component mounting machine disclosed in PTL 1 is configured so that the measurement device is exchangeable, and it is possible to measure electrical characteristics of various electronic components by mutually exchanging measurement devices having different arrangement of measurement terminals. In this type of electronic component mounting machine, it is possible to prevent erroneous mounting of the electronic component and achieve traceability management such as deviation of electrical characteristics of the electronic component by measuring the electrical characteristics of the electronic component.

CITATION LIST

Patent Literature

PTL 1: WO2014/155657

BRIEF SUMMARY

Problem to be Solved

In addition to the above-described electronic component mounting machine, it is conceivable to construct a manufacturing line by arranging a solder printing machine, a board inspection machine, a reflow machine, and the like. Also, in order to mount a large number of electronic components on a circuit board, there are cases where a manufacturing line is constructed by arranging multiple modularized electronic component mounting machines in series.

However, in a conventional mounting system of in which an electronic component mounting machine is arranged in a manufacturing line, it is necessary to provide a measurement device in each of multiple electronic component mounting machines. On the other hand, from the viewpoint of improving production efficiency, it is preferable to reduce the number of electronic components for which electrical characteristics are measured as much as possible compared to the number of electronic components mounted on the circuit board. For example, it is conceivable to limit the timing of measuring the electronic component to timings of replacement or replenishing of a component, or every predetermined number of times of mounting.

In this case, the frequency of measuring the electronic component by the measurement device, that is, the frequency of using the measurement device is lower than the frequency of mounting the electronic component on the circuit board. Therefore, when a measurement device is installed for each electronic component mounting machine, an increase in installation cost will be a problem compared to the frequency of use of the measurement device.

The present disclosure is made in view of the above problems, and an object of the present disclosure is to provide a mounting system that includes multiple mounting machines and is capable of reducing the number of measurement devices that measure electrical characteristics of an electronic component.

Means for Solving the Problem

The mounting system according to the technique disclosed in the present application made in view of the above problems includes: multiple mounting machines that mounts electronic components on a circuit board; a measurement section that is provided in each of the multiple mounting machines; a measurement device that measures electrical characteristics of the electronic component connected to the measurement section; a switching device that connects the measurement device to the measurement section provided in any one of the multiple mounting machines; and a control device that controls the switching device to switch connection between the measurement device and the measurement section, in which, in a case where the control device receives the request information for measuring the electronic component from at least one of the multiple mounting machines, the control device controls the switching device to connect the measurement section of the mounting machine that transmitted the request information to the measurement device and then performs measurement by performing measurement.

In the mounting system, the measurement device is connected to the measurement section provided in each of the multiple mounting machines. The switching device switches the connection between the measurement device and the multiple measurement sections based on control of the control device. In a case where request information requesting to measure the electrical characteristics of the electronic component is received from the mounting machine, the control device controls the switching device to connect the measurement section of the mounting machine that transmitted the request information to the measurement device and then performs measurement. In such a configuration, it is possible to measure electronic components used by the multiple mounting machines with a small number of measurement devices by performing measurement while switching connection by the switching device. Thus, it is possible to reduce the manufacturing cost by installing a number of measurement devices according to the frequency of use.

In addition, the mounting system according to the technique disclosed in the present application may have a configuration in which a storage device that stores a correction value for correcting a measurement error according to electrical characteristics in a measurement path connecting the measurement device and the measurement section provided in any one of the multiple mounting machines is included, and the control device performs correction value setting processing of reading the correction value corresponding to the measurement path used for measurement from the storage device and setting the correction value in the measurement device when measurement processing is performed.

For example, the characteristic impedance of the measurement path (such as a cable for measurement) connecting the switching device and the measurement section varies depending on various factors such as installation conditions such as a cable length or differences in state. On the other hand, in the mounting system, the storage device stores the correction value according to the electrical characteristics of the measurement path. The control device sets the correction value corresponding to the measurement path in the measurement device. In this way, the measurement device may correct the error of the measurement value according to the electrical characteristics of the measurement path and measure the electrical characteristics of the electronic component more accurately.

In addition, the mounting system according to the technique disclosed in the present application may have a configuration in which the control device performs: correction value measurement processing of measuring the correction value by the measurement device in a state where the electronic component is not connected to the measurement section, correction value storing processing of storing the measured correction value in the storage device, measurement path switching processing of switching the measurement path by controlling the switching device, and completion determination processing of determining whether the correction value measurement processing is completed for all the measurement paths corresponding to each of the multiple mounting machines.

In the mounting system, the control device causes the correction value to be measured by the measurement device and stores the measured correction value in the storage device. In addition, the control device determines whether measurement of the correction value is completed for all measurement paths. In this way, for example, the control device may automatically perform processing of sequentially measuring the correction values of multiple measurement paths and storing the correction values in the storage device.

In addition, the mounting system according to the technique disclosed in the present application may have a configuration in which the multiple mounting machines transmit relevant information related to the mounting work in each mounting machine to the control device, the relevant information being transmitted in association with the request information, and the control device includes a buffer section that stores the request information and the relevant information and performs priority setting processing of setting priorities to the multiple pieces of request information based on the relevant information in a case where the plurality pieces of the request information are stored in the buffer section.

In the mounting system, the mounting machine adds relevant information for determining the priority of request information to the request information and transmits the information to the control device. As a result, in a case where multiple pieces of request information are stored in a buffer section, the control device may set an appropriate priority to the request information and first perform measurement processing corresponding to the request information with a higher priority by determining the relevant information or the like.

In addition, the mounting system according to the technique disclosed in the present application may have a configuration in which at least one of the multiple mounting machines performs: reception determination processing of determining whether a characteristic measurement value obtained by measuring the electrical characteristics of the electronic component by the measurement device is received; and mounting priority processing of preferentially mounting an electronic component different from the measurement target electronic component on the circuit board in a case where the characteristic measurement value is not received.

In the mounting system, the mounting machine mounts an electronic component different from the measurement target electronic component on the circuit board until the characteristic measurement value is received from the measurement device. In this way, as compared with the case where the mounting is stopped until the characteristic measurement value is received, it is possible to shorten the mounting time required to mount all the electronic components on the circuit board, thereby improving the manufacturing efficiency.

In addition, the mounting system according to the technique disclosed in the present application may have a configuration in which each of the multiple mounting machines performs request information transmission processing of transmitting the request information to the control device in response to at least one of power-on, replenishing of the electronic component, and replacing of the electronic component.

In the mounting system, it is possible to optimize the timing of using the measurement device and reduce the frequency of use by performing measurement of the electronic component at the time of power-on of the mounting machine or replenishing of the electronic component. As a result, it is possible to share a measurement device with more mounting machines.

Advantageous Effects

According to the technique disclosed in the present application, in the mounting system having multiple mounting machines, it is possible to reduce the number of measurement devices that measure the electrical characteristics of the electronic component.

DETAILED DESCRIPTION

Hereinafter, embodiments of the present disclosure will be described in detail with reference to drawings.

<Configuration of Mounting System>

Figure 1:
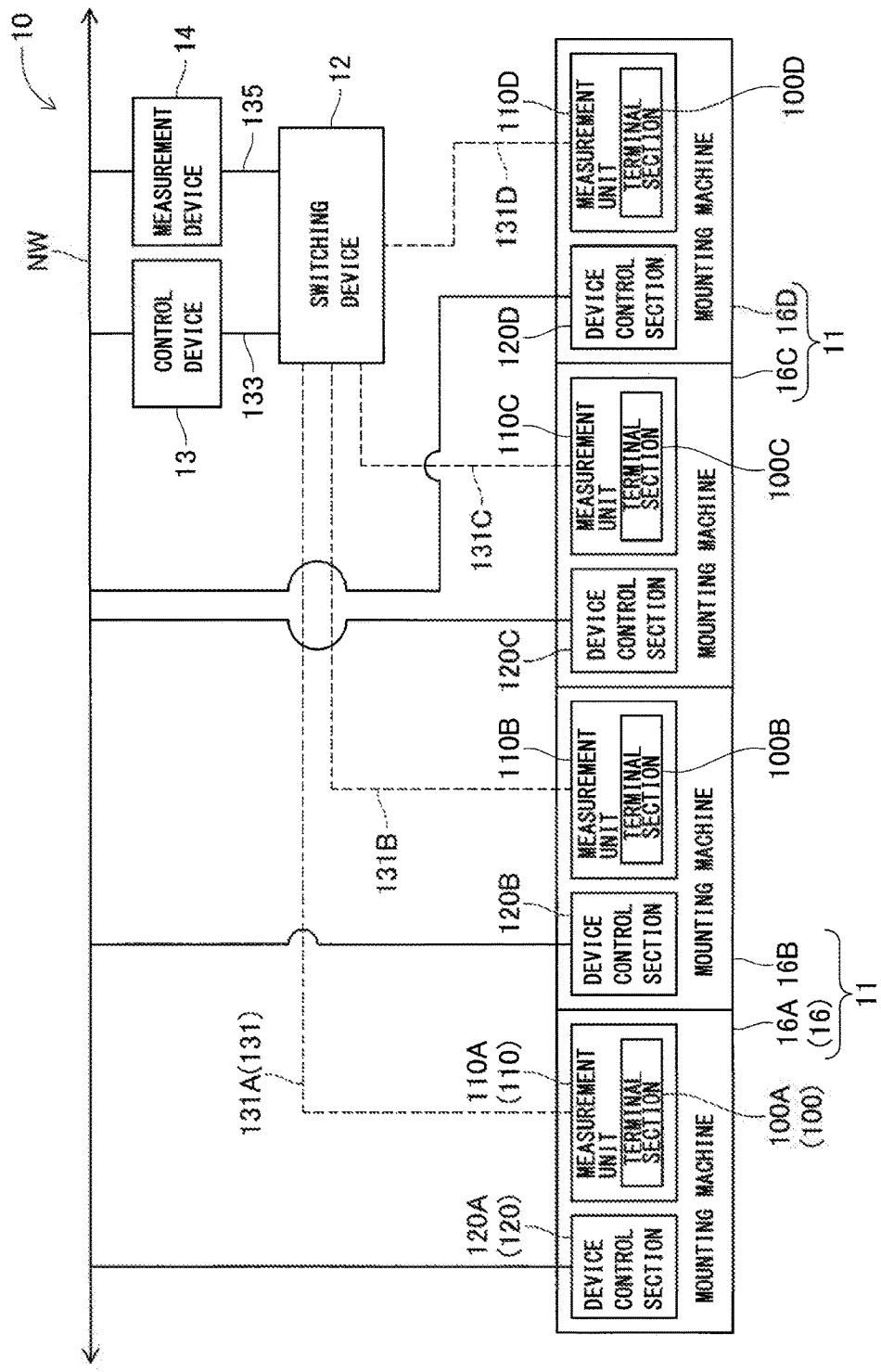
FIG. 1 is a diagram showing a configuration of a mounting system according to an embodiment.

FIG. 1 shows a configuration of a mounting system 10 according to the present embodiment. The mounting system 10 is provided with a plurality (two in FIG. 1) of electronic component mounting devices 11, a switching device 12, a control device 13, and a measurement device 14 arranged along a manufacturing line. The mounting system 10 measures electrical characteristics of an electronic component 140 (see FIG. 4) used by a mounting machine 16 including the multiple electronic component mounting devices 11 using one measurement device 14.

<Configuration of Electronic Component Mounting Device 11>

Figure 2:
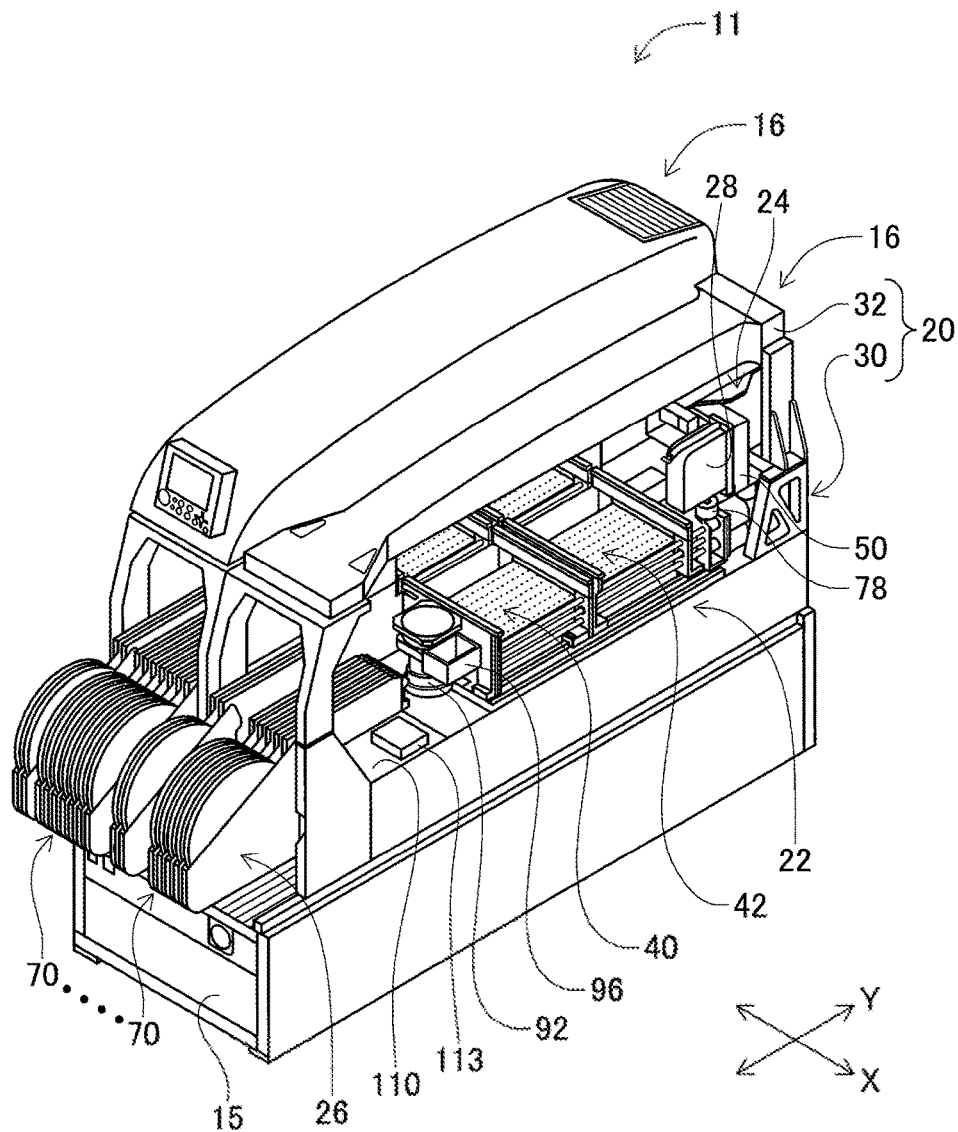
FIG. 2 is a perspective view of an electronic component mounting device.
Figure 3:
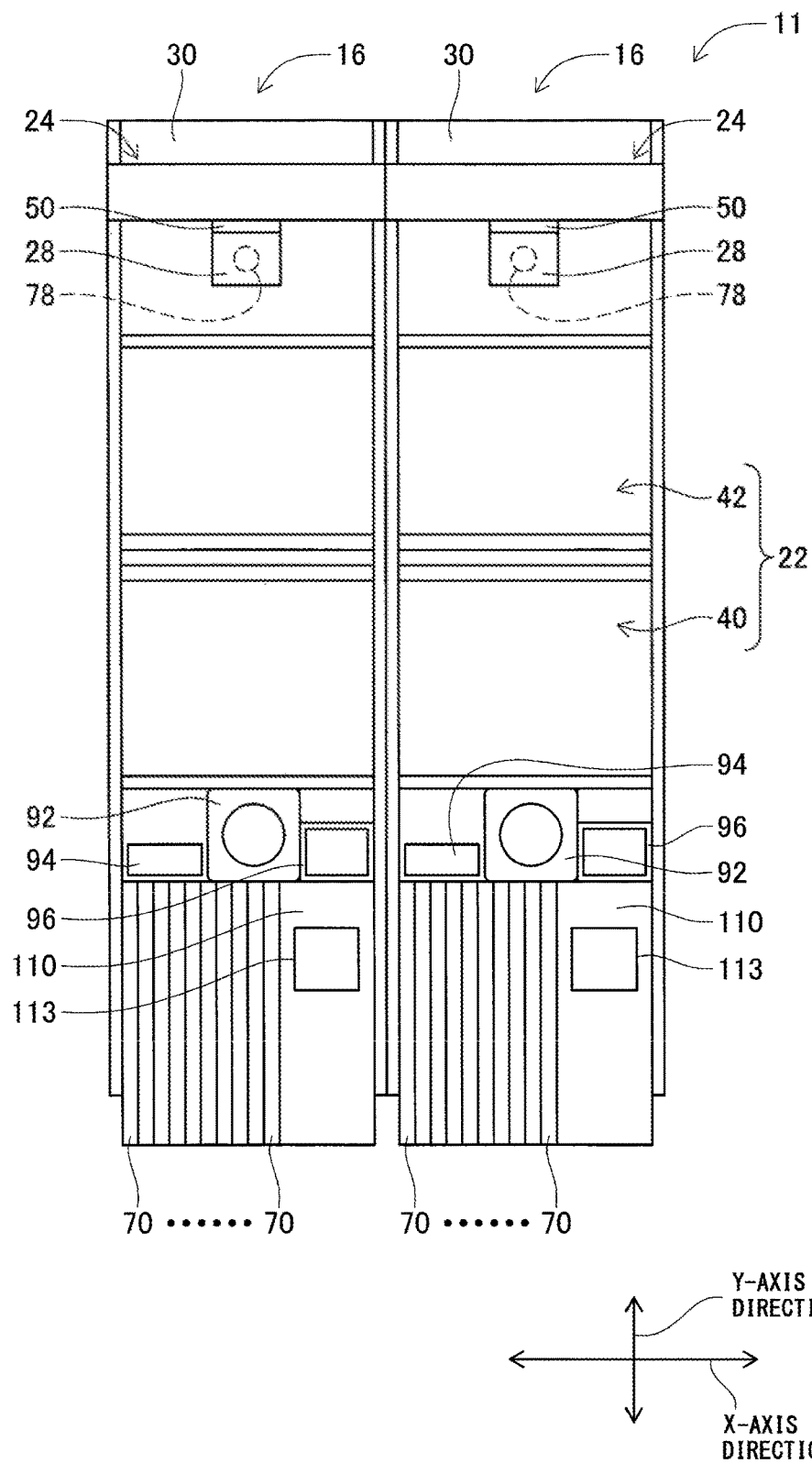
FIG. 3 is a plan view showing the electronic component mounting device from a viewpoint from above.

First, the configuration of the electronic component mounting device 11 will be described. FIGS. 2 and 3 show the electronic component mounting device 11. FIG. 2 is a perspective view of the electronic component mounting device 11, and FIG. 3 is a plan view showing the electronic component mounting device 11 in a state where a cover and the like are removed, from a viewpoint from above. The electronic component mounting device 11 is a device that mounts the electronic component 140 on a circuit board CB (see FIG. 8). The electronic component mounting device 11 includes one system base 15 and two mounting machines 16 arranged side by side on the system base 15. In the following description, the direction in which the mounting machines 16 are aligned is referred to as an X-axis direction, and the horizontal direction orthogonal to the mounting machine 16 is referred to as a Y-axis direction.

Each mounting machine 16 mainly includes a mounting machine main body 20, a conveyance device 22, a mounting head moving device (hereinafter, may be abbreviated as a "moving device") 24, a supply device 26, and a mounting head 28. The mounting machine main body 20 is configured by a frame section 30 and a beam section 32 which is suspended on the frame section 30. The conveyance device 22 includes two conveyor devices 40 and 42. The two conveyor devices 40 and 42 are arranged in the frame section 30 so as to be parallel to each other and to extend in the X-axis direction. Each of the two conveyor devices 40 and 42 conveys the circuit board CB supported by each of the conveyor device 40 and 42 to the X-axis direction by an electromagnetic motor 46 (see FIG. 5). In addition, the circuit board CB is fixedly held at a predetermined position by a board holding device 48 (see FIGS. 5 and 8).

The moving device 24 is an XY-robot type moving device. The moving device 24 includes an electromagnetic motor 52 (see FIG. 5) that slides the slider 50 in the X-axis direction and an electromagnetic motor 54 (see FIG. 5) for sliding the slider 50 in the Y-axis direction. The mounting head 28 is attached to the slider 50. The mounting head 28 moves to an arbitrary position on the frame section 30 by driving the two electromagnetic motors 52 and 54.

The supply device 26 is a feeder type supply device and is arranged at the front end of the frame section 30. The supply device 26 includes a tape feeder 70. The tape feeder 70 accommodates a taped component in a state of being wound. The taped component is a taped product of the electronic component 140 (see FIG. 4). Then, the tape feeder 70 sends the taped component by the feed device 76 (see FIG. 5). Thus, the feeder type supply device 26 supplies the electronic component 140 in a supply position by sending out the taped component. The tape feeder 70 is attachable to and detachable from the frame section 30 and may correspond to the replacement of the electronic component 140 and the like.

Figure 8:
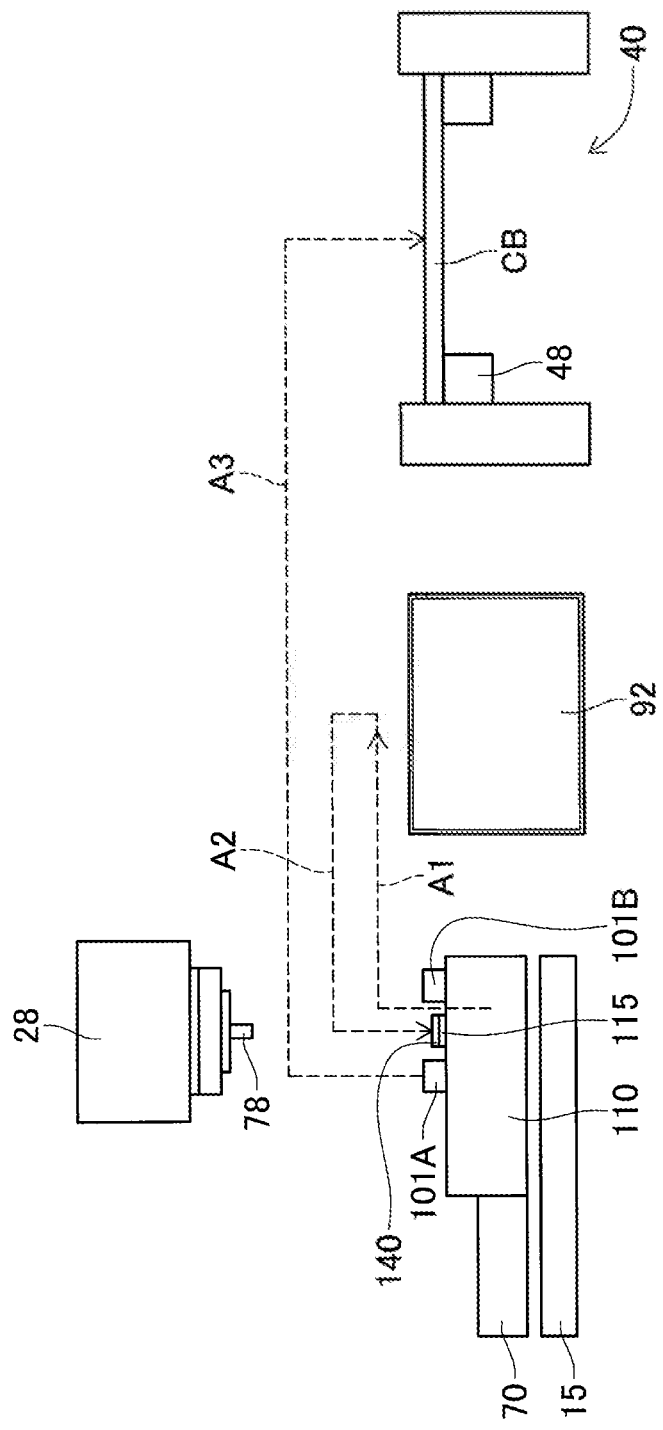
FIG. 8 is a schematic diagram showing an operation of the mounting machine when measuring the electrical characteristics of the electronic component.

The mounting head 28 attaches the electronic component 140 (see FIG. 4) to the circuit board CB (see FIG. 8). The mounting head 28 includes a suction nozzle 78 provided on the lower end face. The suction nozzle 78 leads to a positive and negative pressure supply device 80 (see FIG. 5) via a negative pressure air and positive pressure air passage. The suction nozzle 78 sucks and holds the electronic component 140 by negative pressure and removes the held electronic component 140 by positive pressure. In addition, the mounting head 28 includes a nozzle lifting and lowering device 86 (see FIG. 5) that lifts and lowers the suction nozzle 78. By driving the nozzle lifting and lowering device 86, the mounting head 28 changes the position in the up-down direction of the electronic component 140 to be held.

In addition, the mounting machine 16 includes a mark camera 90 (see FIG. 5) and a component camera 92 (see FIGS. 2 and 3). The mark camera 90 is fixed to the lower face of the slider 50 in a state of facing downward. As a result, the slider 50 is moved by the moving device 24, thus it is possible to image an arbitrary position on the frame section 30. On the other hand, the component camera 92 is provided in the frame section 30 between the conveyance device 22 and the supply device 26 in a state of facing upward and images the electronic component 140 held by the suction nozzle 78 of the mounting head 28.

As shown in FIG. 3, a work tool station 94 is provided in the frame section 30 between the conveyance device 22 and the supply device 26, which is on the side of the X-axis direction with respect to the component camera 92. The work tool station 94 accommodates different suction nozzles 78 of various shapes and the like and performs a work of exchanging the suction nozzle 78 mounted on the mounting head 28 and the accommodated suction nozzle 78. In addition, a discard box 96 is provided on the side opposite to the work tool station 94 with respect to the component camera 92 in the X-axis direction. The discard box 96 is a box for discarding the electronic component 140 that is not suitable for mounting on the circuit board CB.

<Configuration of Measurement Unit 110>

Figure 4:
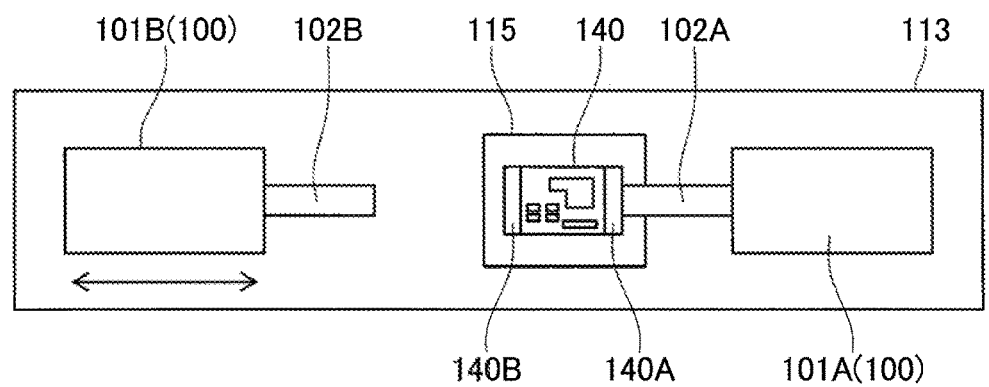
FIG. 4 is a diagram schematically showing a structure of a measurement table.

A measurement unit 110 is provided on the system base 15 which is on the tape feeder 70 side with respect to the discard box 96 on the side of the X-axis direction with respect to the tape feeder 70. On the measurement unit 110, a measurement table 113 is provided. FIG. 4 schematically shows the structure of the measurement table 113. The measurement table 113 is provided with a terminal section 100. As will be described later, the measurement device 14 shown in FIG. 1 is electrically connected to the terminal section 100 of one of the measurement units 110 of the multiple mounting machines 16 by switching the switching device 12. The mounting system 10 connects the electronic component 140 before being mounted on the circuit board CB to the terminal section 100 and measures the electrical characteristics by the measurement device 14.

As with the tape feeder 70, for example, the measurement unit 110 is configured to be detachable from a slot provided in the main body of the mounting machine 16. Therefore, the measurement unit 110 may be moved to another unit having a different type of terminal section 100 or to another mounting machine 16.

The terminal section 100 includes a fixed terminal section 101A fixedly provided with respect to the measurement table 113 and a movable terminal section 101B arranged opposite to the fixed terminal section 101A and capable of changing the relative distance from the fixed terminal section 101A. The fixed terminal section 101A includes a probe (exploratory needle) 102A made of a thin conductor and pressed against an electrode 140A of the electronic component 140. Similarly, the movable terminal section 101B includes a probe (exploratory needle) 102B made of a thin conductor and pressed against an electrode 140B of the electronic component 140.

The movable terminal section 101B moves in the direction of the arrow shown in FIG. 4 by driving an electromagnetic motor 105 (see FIG. 5) provided in the measurement unit 110. The movable terminal section 101B is designed to be driven with a substantially constant pressing force toward the fixed terminal section 101A. On the upper face of the measurement table 113 between the fixed terminal section 101A and the movable terminal section 101B, there is provided a component holding section 115 that holds the electronic component 140 transferred and mounted by mounting head 28. The component holding section 115 stably maintains the posture of the electronic component 140 such that the electrode 140A of the electronic component 140 faces the probe 102A and the electrode 140B provided on the side opposite to the electrode 140A faces the probe 102B.

When the movable terminal section 101B is moved toward the fixed terminal section 101A from the state shown in FIG. 4, the probe 102A is brought into pressure contact with the electrode 140A on one side of the electronic component 140 to be conductive and the probe 102B is brought into pressure contact with the electrode 140B on the other side to be conductive. In this way, it is possible to measure the electrical characteristics of the electronic component 140. The number and position of the probes 102A and the like shown in FIG. 4, the number and position of the electrodes 140A and the like of the electronic component 140 are merely examples and are appropriately changed according to the type of the electronic component 140. In addition, the measurement unit 110 may include multiple types of fixed terminal sections 101A and movable terminal section 101B according to the type of the electronic component 140.

<Configuration of Device Control Section 120>

Figure 5:
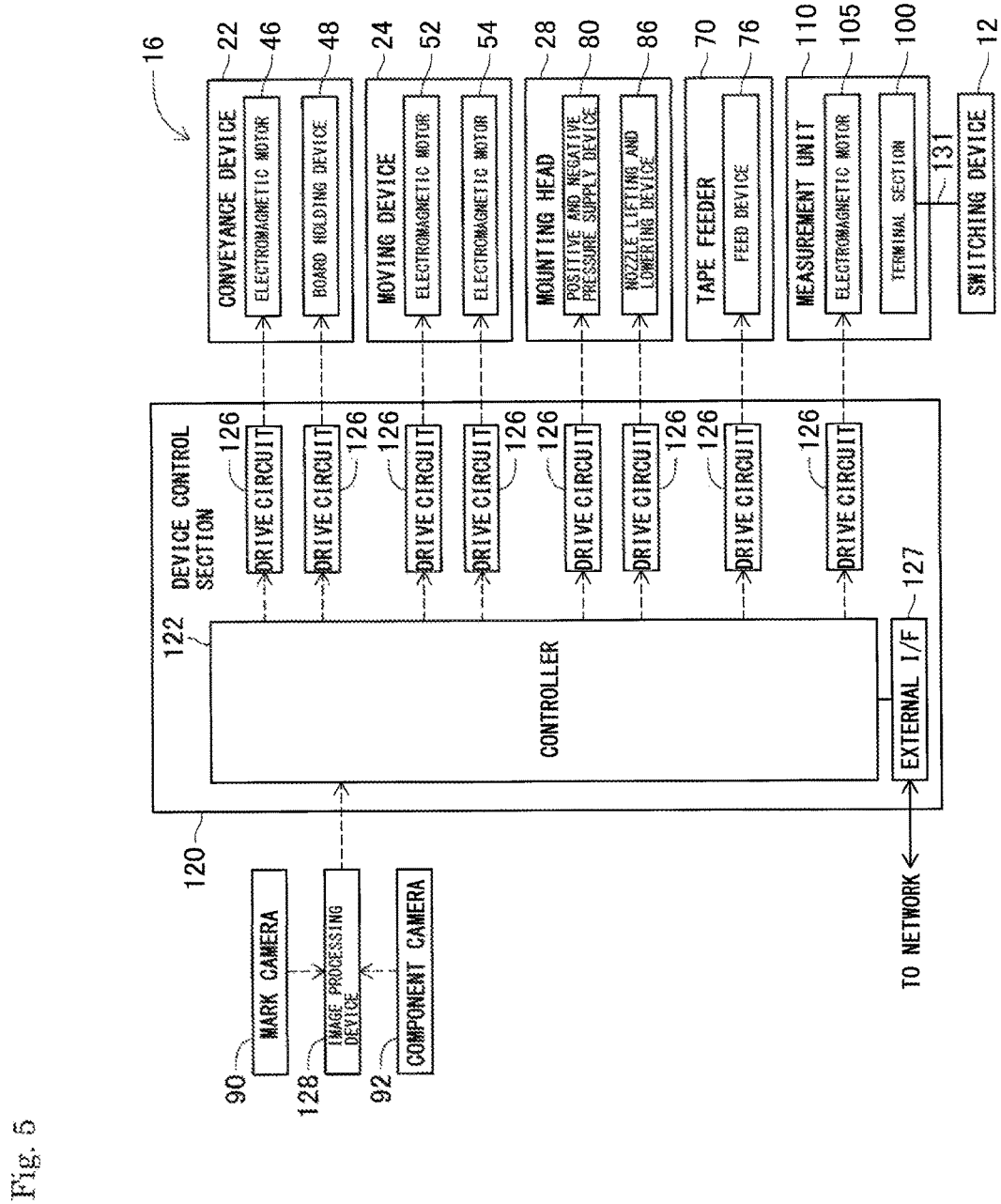
FIG. 5 is a block diagram showing a configuration of a mounting machine.

As shown in FIG. 5, the device control section 120 of the mounting machine 16 includes a controller 122 and multiple drive circuits 126. The multiple drive circuits 126 are connected to the electromagnetic motors 46, 52, 54, and 105, the board holding device 48, the feed device 76, the positive and negative pressure supply device 80, and the nozzle lifting and lowering device 86. The controller 122 includes a CPU, a ROM, a RAM, and the like, mainly consist of a computer, and is connected to multiple drive circuits 126. The controller 122 controls the conveyance device 22 and the like via the drive circuit 126.

In addition, the controller 122 is connected to an image processing device 128 that processes the image data obtained by the mark camera 90 and the component camera 92. As a result, the controller 122 acquires various information from the image data. In addition, the controller 122 is connected to a network NW via an external interface 127. The controller 122 may transmit and receive data to and from the control device 13 and the measurement device 14 via the network NW.

<Mounting Work by Mounting Machine 16>

The mounting machine 16 is capable of performing a mounting work with the mounting head 28 on the circuit board CB held by the conveyance device 22 with the above-described configuration. Specifically, the controller 122 controls the conveyance device 22 to convey the circuit board CB to a working position and to fixedly hold the circuit board CB by the board holding device 48 at the work position. In addition, the controller 122 drives the tape feeder 70 to send out a taped component (electronic component 140) and to supply the electronic component 140 in the supply position. Then, the controller 122 moves the mounting head 28 above the supply position of the electronic component 140 and causes the suction nozzle 78 to suck and hold the electronic component 140. The controller 122 moves the mounting head 28 above the circuit board CB and mounts the electronic component 140 held by the mounting head 28 on the circuit board CB.

<Other Configuration of Mounting System 10>

Returning to FIG. 1, the configuration of the other part of the mounting system 10 will be described. In the following description, as shown in FIG. 1, in a case of multiple mounting machines 16 and the like are distinguished from each other for description, the mounting machines 16 will be referred to as a "mounting machine 16A" and the like with an alphabet after the reference numerals. In addition, in a case where there is no need to distinguish between the multiple mounting machines 16 and the like, description will be given without attaching "alphabet" to "mounting machine 16" or the like.

As shown in FIG. 1, the switching device 12 is connected to the terminal section 100 of the measurement unit 110 of each of the mounting machines 16 via a measurement cable 131. In addition, the switching device 12 is connected to the control device 13 via an I/O cable 133. The control device 13 is, for example, a personal computer, and controls the switching device 12 by communication via the I/O cable 133.

Figure 6:
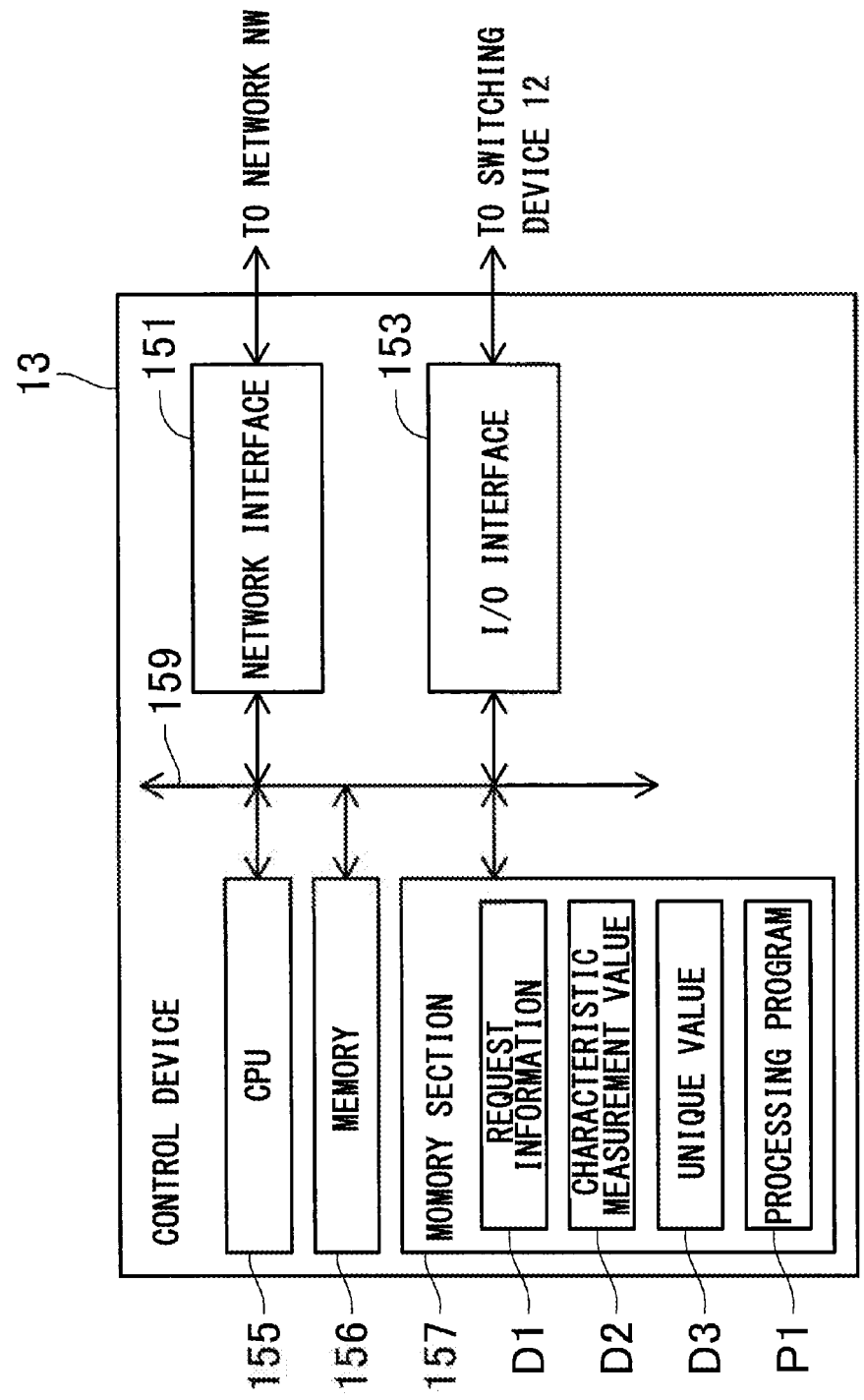
FIG. 6 is a block diagram showing a configuration of a control device.

FIG. 6 shows a part of the configuration of the control device 13 and shows a part related to the present application. As shown in FIG. 6, the control device 13 includes a network interface 151, an I/O interface 153, a CPU 155, a memory 156, and a memory section 157, and these devices are mutually connected via an internal bus 159. The network interface 151 is connected to the network NW via, for example, a LAN cable. The I/O interface 153 is connected to the switching device 12 via the I/O cable 133. The CPU 155 performs a processing program P1 stored in the memory section 157 and performs processing of various functions, for example, request information D1 requesting measurement from the mounting machine 16. The memory 156 is, for example, a RAM and is a work memory used in the performing of the processing program P1 by the CPU 155 and the like. The memory section 157 is, for example, a storage device including a ROM, a hard disk, and the like. In addition to the above processing program P1 and request information D1, in the memory section 157, a characteristic measurement value D2 and a unique value D3 to be described later are stored.

In addition, the switching device 12 shown in FIG. 1 is connected to one terminal section 100 among terminal sections 100A to 100D of the multiple measurement units 110A to 110D under the control of the control device 13. In addition, the switching device 12 is connected to the measurement device 14 via a measurement cable 135. The measurement device 14 is connected to the terminal section 100 of one of the multiple terminal sections 100A to 100D via the switching device 12. Therefore, in the mounting system 10 of the present embodiment, one measurement device 14 is shared by the four mounting machines 16.

The measurement device 14 may measure the electrical characteristics of the electronic component 140 by applying a voltage to the probes 102A and 102B connected to the electrodes 140A and 140B of the electronic component 140 in a state of being connected to the terminal section 100 of the measurement unit 110. Specifically, in the case of an electronic component 140 such as a capacitor, electrostatic capacitance is measured, and in the case of an electronic component 140 such as a resistance element or a diode, a resistance value is measured.

The measurement device 14 transmits the acquired characteristic measurement value D2 to the control device 13. The control device 13 transmits the characteristic measurement value D2 received from the measurement device 14 to the device control section 120 of the mounting machine 16 connected to the switching device 12. As a result, each of the device control sections 120A to 120D may acquire the characteristic measurement value D2 measured by the measurement device 14.

<Operation of Mounting Machine 16 in Measurement Processing>

Next, the operation of the mounting machine 16 when measuring the electrical characteristics of the electronic component 140 will be described with reference to FIG. 7. Each of the device control sections 120A to 120D of the respective mounting machines 16A to 16D repeatedly performs the processing shown in FIG. 7 after being activated, for example. First, the controller 122 of the device control section 120 determines whether an event requiring measurement of the electronic component 140 has occurred in step (hereinafter, described as a unit "S") 11 in FIG. 7.

Here, as described above, in the mounting machine 16, the mounting head 28 sucks and holds the electronic component 140 supplied by the tape feeder 70, and the electronic component 140 is mounted on the circuit board CB. In the mounting machine 16 configured as described above, for example, in a case where the number of electronic components 140 accommodated in the tape feeder 70 is less than a predetermined number in order to avoid supply shortage of the electronic component 140, a screen for prompting replacement and the like of the tape feeder 70 is displayed on a display device (not illustrated). Then, for example, an operator replaces the tape feeder 70 according to the display screen. Alternatively, instead of exchanging the tape feeder 70 itself, the operator replenishes the electronic component 140 by performing splicing to join replenishment tape to the tape of a reel on which carrier tape holding the electronic component 140 is wound. In addition, even in a case where the type of the mounting board to be manufactured is changed, the operator replaces the tape feeder 70 according to the type of the electronic component 140 to be used.

In this case, the operator may erroneously replace the tape feeder 70 or the like accommodating the electronic component 140 different from the electronic component 140 to be mounted. In addition, there is a case where a component maker delivers the tape feeder 70 in which the electronic component 140 different from the regular electronic component 140 is taped. In view of this, in the mounting machine 16, when the tape feeder 70 is exchanged or the like, the electrical characteristics of the electronic component 140 is measured, and it is determined whether an appropriate electronic component 140 is replenished. For example, erroneous mounting may be detected by measuring the electrical characteristics of several electronic components 140 supplied from the replaced tape feeder 70. The event requiring measurement of the electronic component 140 is not limited to replenishment of the electronic component 140 described above, but may occur, for example, when the power of the electronic component mounting device 11 is powered on. For example, the controller 122 may sequentially measure the electronic component 140 of the tape feeder 70 mounted when the electronic component mounting device 11 is powered on.

The controller 122 repeatedly performs the determination processing of S11 until an event requiring measurement occurs (S11: NO). In addition, when an event requiring measurement occurs (S11: YES), the controller 122 starts the processing of moving the electronic component 140 to the measurement table 113 (S13).

FIG. 8 schematically shows the operation of the mounting head 28 to transfer the electronic component 140 to the measurement unit 110. When measuring the electrical characteristics of the electronic component 140, the mounting head 28 moves the electronic component 140 in the order indicated by arrows A1 and A2 shown in FIG. 8 and transfers the electronic component 140 to the measurement unit 110.

First, the mounting head 28 moves to the supply position of the electronic component 140 of the tape feeder 70, and the electronic component 140 is sucked and held by the suction nozzle 78. Next, as indicated by the arrow A1, the mounting head 28 moves to above the component camera 92. The controller 122 performs imaging by the component camera 92 in accordance with the movement of the mounting head 28. Based on the captured image data, the controller 122 determines whether the outer shape of the electronic component 140 is within an allowable error range and whether the suction posture is good, or the like.

When the determination result is good, the controller 122 moves the mounting head 28 to the measurement unit 110 as shown by the arrow A2 and places the electronic component 140 on the component holding section 115. For example, in a case where the outer shape is out of the allowable error range, the controller 122 controls the mounting head 28 to discard the electronic component 140 sucked by the suction nozzle 78 to the discard box 96.

Returning to FIG. 7, when the controller 122 places the electronic component 140 on the measurement table 113, the controller 122 moves the movable terminal section 101B (see FIG. 4) and sets the electronic component 140 in a measurable state (S13). The controller 122 transmits request information D1 requesting measurement to the control device 13 via the network NW (see FIG. 1) (S15). In addition, for example, the controller 122 includes identification information (device ID) and the like for identifying the multiple mounting machines 16 in the request information D1 and transmits the request information D1. As a result, the control device 13 may determine the mounting machine 16 of a transmission source based on the identification information.

Next, the controller 122 performs a work that may be processed ahead of time even during the performing of measurement processing, such as another work, for example, a work of mounting another type of electronic component 140 on the circuit board CB (S17). In a case where the measurement device 14 is shared by the multiple mounting machines 16, it is conceivable that the request information D1 from the multiple mounting machines 16 occurs at the same time and it takes time to measure. Therefore, the controller 122 periodically determines whether the characteristic measurement value D2 which is the measurement result of the measurement device 14 is received from the control device 13 (S19). The controller 122 repeatedly performs the preceding processing of S17 until the characteristic measurement value D2 is received (S19: NO).

For example, as indicated by an arrow A3 in FIG. 8, the mounting head 28 sucks and holds the electronic component 140 of a type different from the electronic component 140 performing the measurement from the supply position of the corresponding tape feeder 70 and moves to the position above the circuit board CB while passing over the component camera 92. At this time, the controller 122 processes the image data captured by the component camera 92 and performs a determination or correction work of an error in the outer shape, position, and orientation of the electronic component 140 sucked and held by the suction nozzle 78. The mounting head 28 then mounts the electronic component 140 on the circuit board CB.

In addition, in S19, when receiving the measurement result (characteristic measurement value D2) from the control device 13 (S19: YES), the controller 122 determines the contents of the characteristic measurement value D2 (S21). For example, the controller 122 determines whether the received measurement result is within an allowable range based on the standard, performance, nominal values (specification value) of the electronic component 140 set in control data for mounting the electronic component 140 on the circuit board CB. Here, the control data is data for controlling the mounting machine 16 in which the position of mounting the electronic component 140 on the circuit board CB, the slot position of the tape feeder 70 supplying the electronic component 140, and the like are set.

When it is determined that the electronic component 140 is mountable (S21: YES) by determining the contents of the characteristic measurement value D2, the controller 122 sets information that the electronic component 140 is mountable as the status of the tape feeder 70 that supplied the measured electronic component 140 (S23) and ends the measurement processing. In addition, for example, the controller 122 performs the processing from S11 again and starts the mounting work and the like of the electronic component 140 of which the measurement result is good. In addition, the controller 122 stores and holds the information of the set status in a memory or the like until the tape feeder 70 corresponding to the status information is exchanged or the like.

on the other hand, when it is determined that the electronic component 140 is not the mountable (S21: NO) by determining the contents of the characteristic measurement value D2, the controller 122 sets information that the electronic component 140 is not mountable as the status of the tape feeder 70 that supplied the measured electronic component 140 (S25) and ends the measurement processing. For example, the controller 122 informs a user by notifying a display screen or the like that the measurement result is an error. As a result, the user may take appropriate measures such as replacing the problematic tape feeder 70.

<Operation of Control Device 13 in Measurement Processing>

Figure 9:
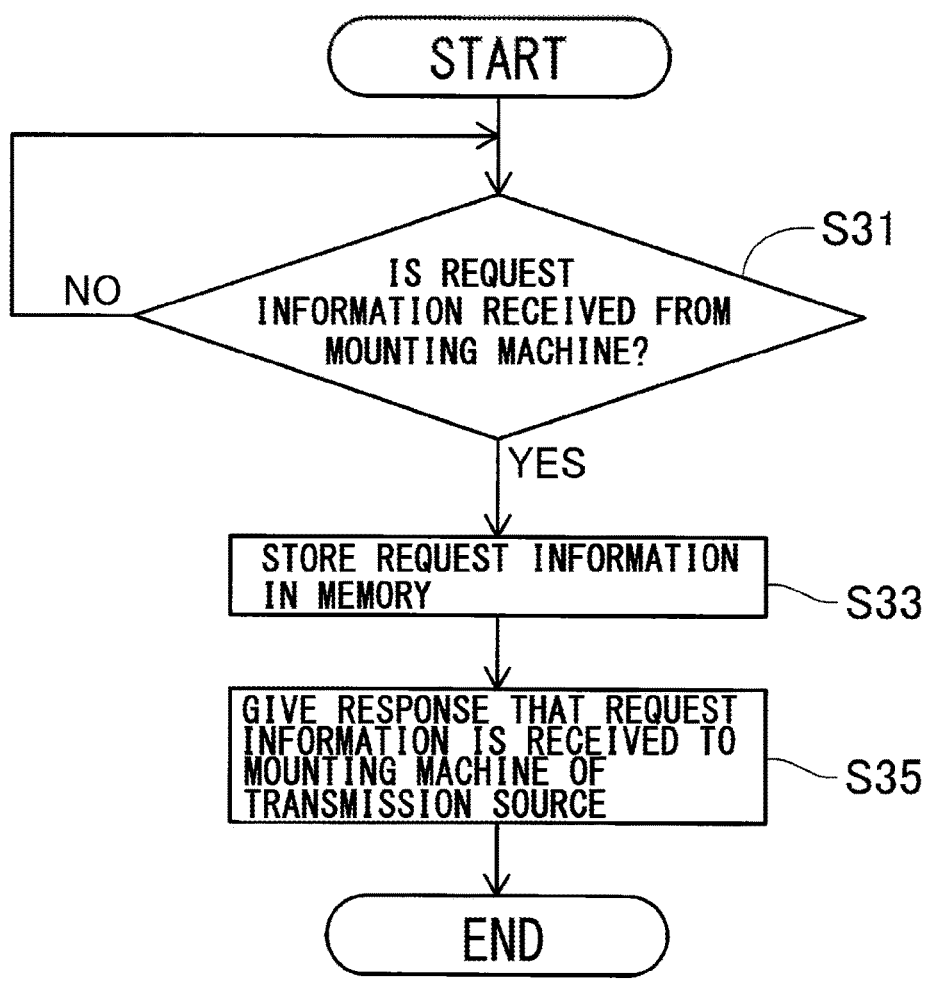
FIG. 9 is a flowchart showing contents of processing of receiving request information by the control device.

Next, the operation of the control device 13 when measuring the electrical characteristics of the electronic component 140 will be described with reference to FIGS. 9 and 10. FIG. 9 shows processing of receiving the request information D1 by the control device 13. The control device 13 performs the processing program P1 (see FIG. 6), for example, after being activated by the CPU 155 and repeatedly performs the processing shown in FIG. 9.

The control device 13 determines whether the request information D1 is received from any mounting machine 16 among the multiple mounting machines 16A to 16D via the network NW in S31 of FIG. 9. The control device 13 repeatedly performs the determination processing of S31 until the request information D1 is received (S31: NO).

In addition, when receiving the request information D1 (S31: YES), the control device 13 stores the received request information D1 in the memory 156 (see FIG. 6) or the memory section 157 (S33). The control device 13 determines the mounting machine 16 of the transmission source based on the identification information of the mounting machine 16 included in the request information D1 and returns the fact that the reception of the request information D1 is completed to the mounting machine 16 of the transmission source as a response (S35). The control device 13 ends the processing shown in FIG. 9 and starts the processing from S31 again.

Next, the processing of the request information D1 after being received by the control device 13 will be described with reference to FIG. 10. First, in S41 of FIG. 10, the control device 13 performs processing of reading the request information D1 from the memory 156. In this process, in a case where multiple pieces of request information D1 are stored in the memory 156, the control device 13 sequentially processes the request information D1 previously stored in the memory 156 in order, for example.

The processing order of the request information D1 by the control device 13 may be other methods. For example, the control device 13 may preferentially process the request information D1 having a larger number of mounting points with respect to the circuit board CB of the requested electronic component 140. When the work of the electronic component 140 with a large number of mounting points is stopped, since it is conceivable that the influence on the mounting work and the like of the other type of electronic component 140 is big, it is effective to first process the electronic component 140 with a large number of mounting points. In this case, the controller 122 attaches the information on the number of mounting points of the electronic component 140 as measurement target to the request information D1 and transmits the information to the control device 13, for example in S15 of FIG. 7. As a result, the control device 13 may determine and set the priority of the request information D1 based on the information on the number of mounting points (an example of the relevant information) attached to the received request information D1.

Alternatively, the control device 13 may preferentially process the request information D1 of the mounting machine 16, which has the largest number of types of electronic components 140 that need to be measured, among the mounting machines 16 transmitting the request information D1, for example. For example, in a case where five types of electronic components 140 that need to be measured, the mounting machine 16A attaches information indicating that there are four remaining measurement schedules (an example of relevant information) to the request information D1 and transmits the information to the control device 13. In addition, at the same time, in a case where six types of electronic components 140 that need to be measured, the mounting machine 16B attaches information indicating that there are five remaining measurement schedules to the request information D1 and transmits the information to the control device 13. In this case, the control device 13 preferentially processes the request information D1 of the mounting machine 16B, which has many types of electronic components 140 that need to be measured based on the relevant information attached to the request information D1 stored in the memory section 157. In this way, it is possible to prevent the production efficiency of the mounting system 10 from deteriorating due to a bottleneck by stopping the manufacturing of the mounting machine 16B having the largest number of electronic components 140 to be measured.

In addition, the control device 13 is not limited to the above example, and for example, among the mounting machines 16 transmitting the request information D1, the control device 13 may preferentially process the number of components to be mounted on one circuit board CB, that is, the request information D1 of the mounting machine 16 having the largest number of all components to be mounted including types other than the electronic component 140 as the measurement target. In addition, for example, the control device 13 may preferentially process the request information D1 of the mounting machine 16 that produces one circuit board CB among the mounting machines 16 transmitting the request information D1, with the longest production time. In this case as well, it is possible to preferentially process the request information D1 of the mounting machine 16, which has the possibility of becoming a bottleneck in the manufacturing line, thereby preventing the production efficiency of the mounting system 10 from deteriorating. In addition, the control device 13 may combine and performs multiple priority determination methods described above.

Returning to FIG. 10, the control device 13 controls the switching device 12 to connect the mounting machine 16 and the measurement device 14 corresponding to the request information D1 read from the memory section 157 in S41 (S43).

Next, the control device 13 reads the unique value D3 corresponding to the mounting machine 16 connected to the switching device 12 from the memory section 157 and transmits the read unique value D3 via the network NW to the measurement device 14 (S45). Here, the characteristic impedance of the measurement path (measurement cables 131A to 131D, and the like) connecting the switching device 12 and each of the measurement units 110A to 110D may vary depending on the installation state difference or the like. On the other hand, it is conceivable to measure in advance the unique value D3 obtained by correcting the measurement path with the terminal section 100 open (open correction) and the terminal section 100 short-circuited (short correction) and correct the measurement result when the electronic component 140 is measured by the unique value D3. Therefore, in the memory section 157 of the control device 13, the unique value D3 corresponding to each of the mounting machines 16A to 16D is stored in advance. By correcting the measurement result based on the unique value D3 received from the control device 13, the measurement device 14 may suppress the influence of the characteristic impedance of the measurement path and measure the characteristic measurement value D2 with high accuracy.

After transmitting the unique value D3 to the measurement device 14 in S45, the control device 13 transmits an instruction for starting measurement to the measurement device 14 (S47). When receiving the characteristic measurement value D2 from the measurement device 14, the control device 13 transfers the received characteristic measurement value D2 to the mounting machine 16 of which request information D1 is transmitted (S49). The controller 122 of the mounting machine 16 detects that the characteristic measurement value D2 is received from the control device 13 in S19 of FIG. 7.

<Measurement of Unique Value D3>

Next, the operation of measuring unique value D3 will be described with reference to FIG. 11. For example, the user may start the processing shown in FIG. 11 for the mounting system 10 by operating the control device 13 and performing the predetermined processing program P1. For example, in a case where the mounting system 10 is activated for the first time after being installed in a factory, replacement of a part of the mounting system 10 is performed, the measurement cable 131 is changed or the position of measurement device 14, switching device 12, or the like is changed, the user measures the unique value D3.

Figure 11:
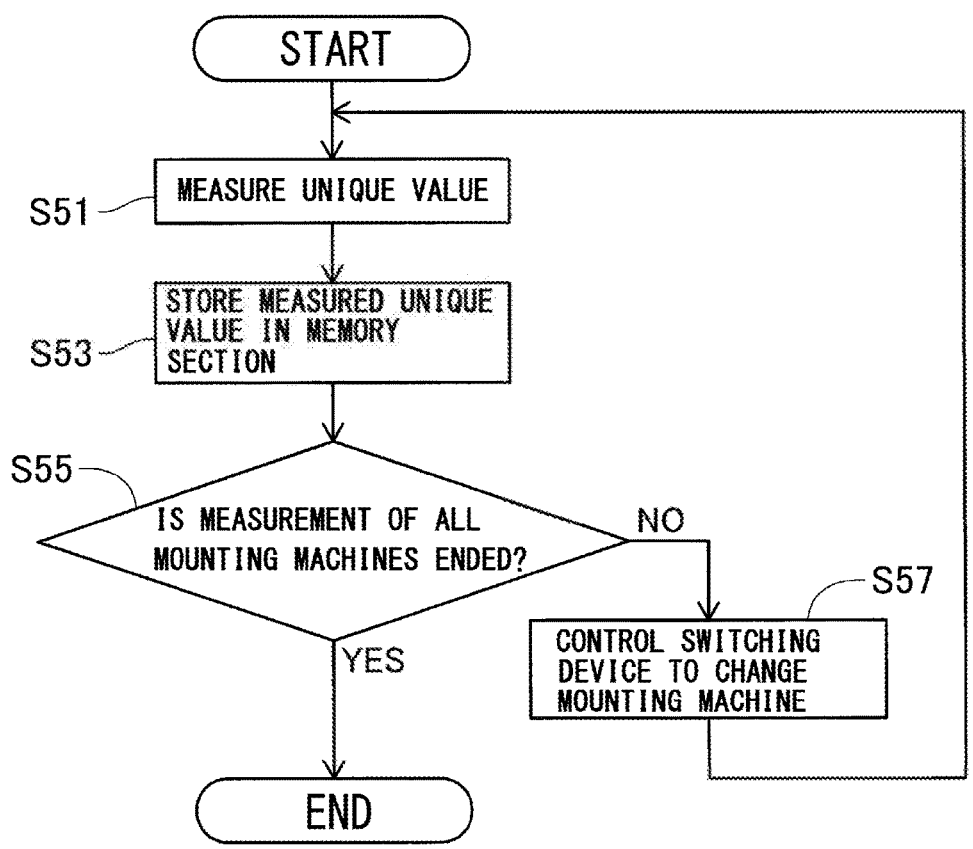
FIG. 11 is a flowchart showing a measurement operation of a unique value by the control device.

First, in S51 of FIG. 11, the control device 13 controls the measurement device 14 and the mounting machine 16 connected to the measurement device 14 and measures the unique value D3 corresponding to the mounting machine 16 currently connected to the measurement device 14. The control device 13 stores the unique value D3 measured by implementing the above-described open correction and the like in the memory section 157 (S53). The control device 13 performs processing of storing the unique value D3 in association with the ID and the like of the mounting machine 16 that performed the measurement (S53). In addition, the control device 13 stores the information related to the mounting machine 16 for which measurement of the unique value D3 is completed in the memory section 157.

Next, the control device 13 determines whether the measurement of the unique value D3 is completed for all the mounting machines 16 based on the information of the measured mounting machine 16 stored in the memory section 157 (S55). In a case where the measurement is not completed (S55: NO), the control device 13 controls the switching device 12 to switch the mounting machine 16 (S57) and performs the processing from S51 for the next mounting machine 16. In addition, in a case where measurement of the unique value D3 is completed for all the mounting machines 16 (S55: YES), the control device 13 ends the processing shown in FIG. 11. By appropriately performing such processing, the control device 13 may store the unique value D3 for all the mounting machines 16 in the memory section 157 in advance.

In addition, the mounting machine 16 is an example of a mounting machine. The terminal section 100 of the measurement unit 110 is an example of a measurement section. The memory 156 is an example of a buffer section. The memory section 157 is an example of a storage device. The processing of S11 and S15 in FIG. 7 is an example of request transmission processing. The processing of S17 is an example of mounting priority processing. The processing of S19 is an example of reception determination processing. The processing in S41 of FIG. 10 is an example of priority setting processing. The processing of S43 and S47 is an example of measurement processing. S45 is an example of correction value setting processing. S51 of FIG. 11 is an example of correction value measurement processing. The processing of S53 is an example of correction value storing processing. The processing of S55 is an example of completion determination processing. The unique value D3 is an example of a correction value.

According to the present embodiment described in detail above, the following effects are obtained.

Effect 1

Figure 10:
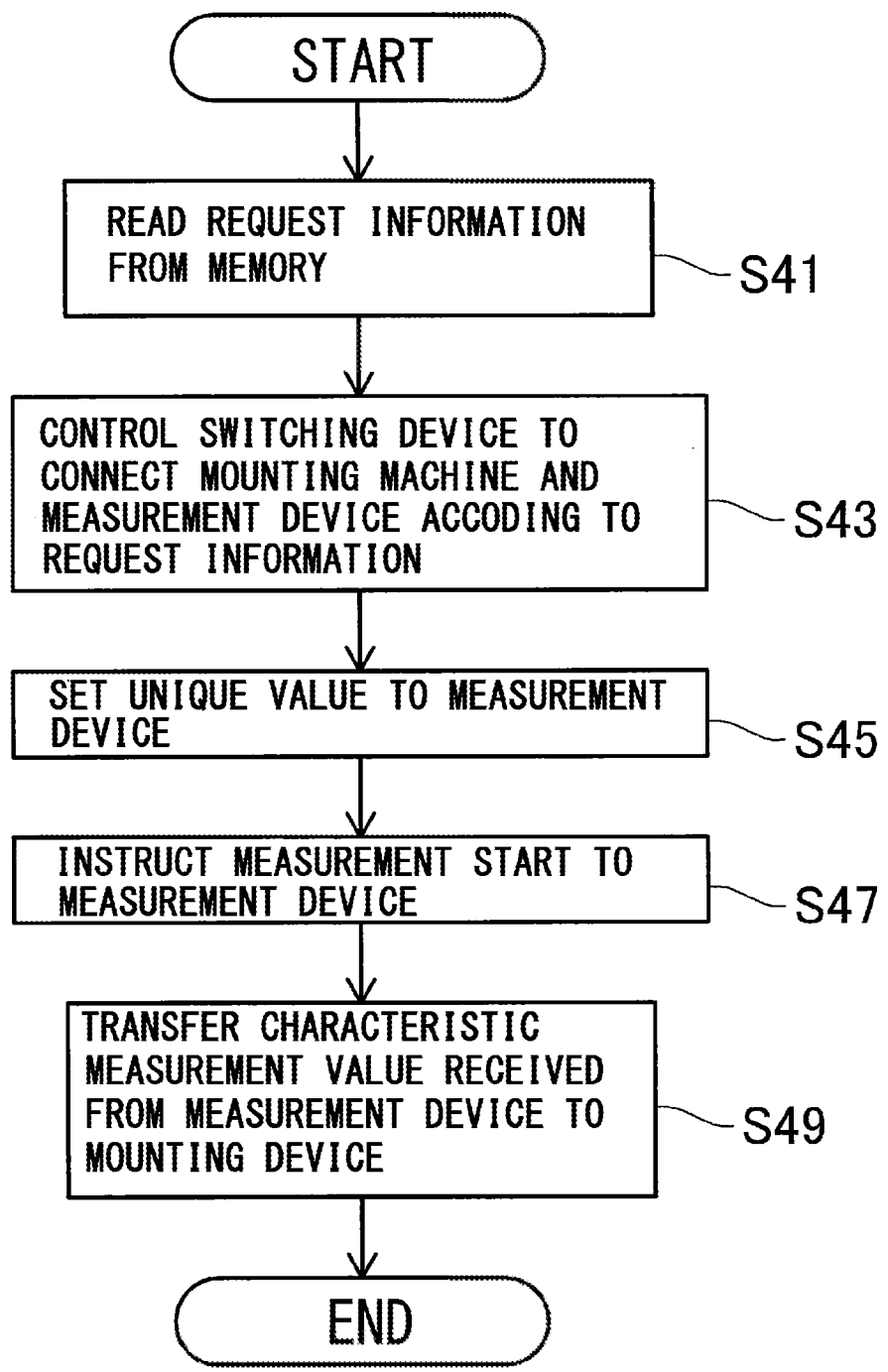
FIG. 10 is a flowchart showing contents of control based on request information by the control device.

The control device 13 controls the switching device 12 to connect the mounting machine 16 and the measurement device 14 corresponding to the request information D1 read from the memory section 157 in S41 of FIG. 10 (S43). The control device 13 transmits an instruction for starting measurement to the measurement device 14 (S47) and transfers the received characteristic measurement value D2 to the mounting machine that requested measurement when receiving the characteristic measurement value D2 from the measurement device 14 (S49). In such a configuration, it is possible to measure the electrical characteristics of the electronic component 140 used by the four mounting machines 16 by one measurement device 14 by performing measurement while switching the connection by the switching device 12. As a result, it is possible to reduce the manufacturing cost by installing a number of measurement devices 14 according to the frequency of use.

Here, for the purpose of measuring the electrical characteristics of the electronic component 140, there are, for example, traceability management and elimination of inappropriate components, in addition to the prevention of erroneous mounting of the tape feeder 70. It is important to grasp the extent to which the characteristic measurement value D2 of the electronic component 140 deviates from a nominal value (specification value) in terms of traceability management and the like. In addition, among the inexpensive electronic components 140, there are inappropriate components whose characteristics exceed the error range. In these cases, the electrical characteristics of the electronic component 140 supplied from the same reel do not change much in many cases, and it is conceivable that an error due to the electrical characteristics may be sufficiently evaluated in measurement by sampling. Specifically, for example, it is conceivable to measure several components after the component exchange. In this way, it is possible to manage traceability and eliminate inappropriate components.

Effect 2

The control device 13 reads the unique value D3 corresponding to the mounting machine 16 connected to the switching device 12 from the memory section 157 and transmits the read unique value D3 via the network NW to the measurement device 14 (S45 of FIG. 10). By correcting the measurement result based on the unique value D3 received from the control device 13, the measurement device 14 may suppress the influence of the characteristic impedance of the measurement path and measure the characteristic measurement value D2 with high accuracy.

Effect 3

In S51 of FIG. 11, the control device 13 measures the unique value D3 according to the measurement path of the mounting machine 16 connected to the measurement device 14 and stores the measured unique value D3 in the memory section 157 (S53). In a case where measurement of the unique value D3 for all the mounting machines 16 is not completed (S55: NO), the control device 13 controls the switching device 12 to switch the mounting machine 16 (S57) and performs measurement of the unique value D3 for the next mounting machine 16. As a result, the control device 13 may automatically store the unique value D3 of the measurement paths corresponding to all the mounting machines 16 in the memory section 157 in advance.

Effect 4

Figure 7:
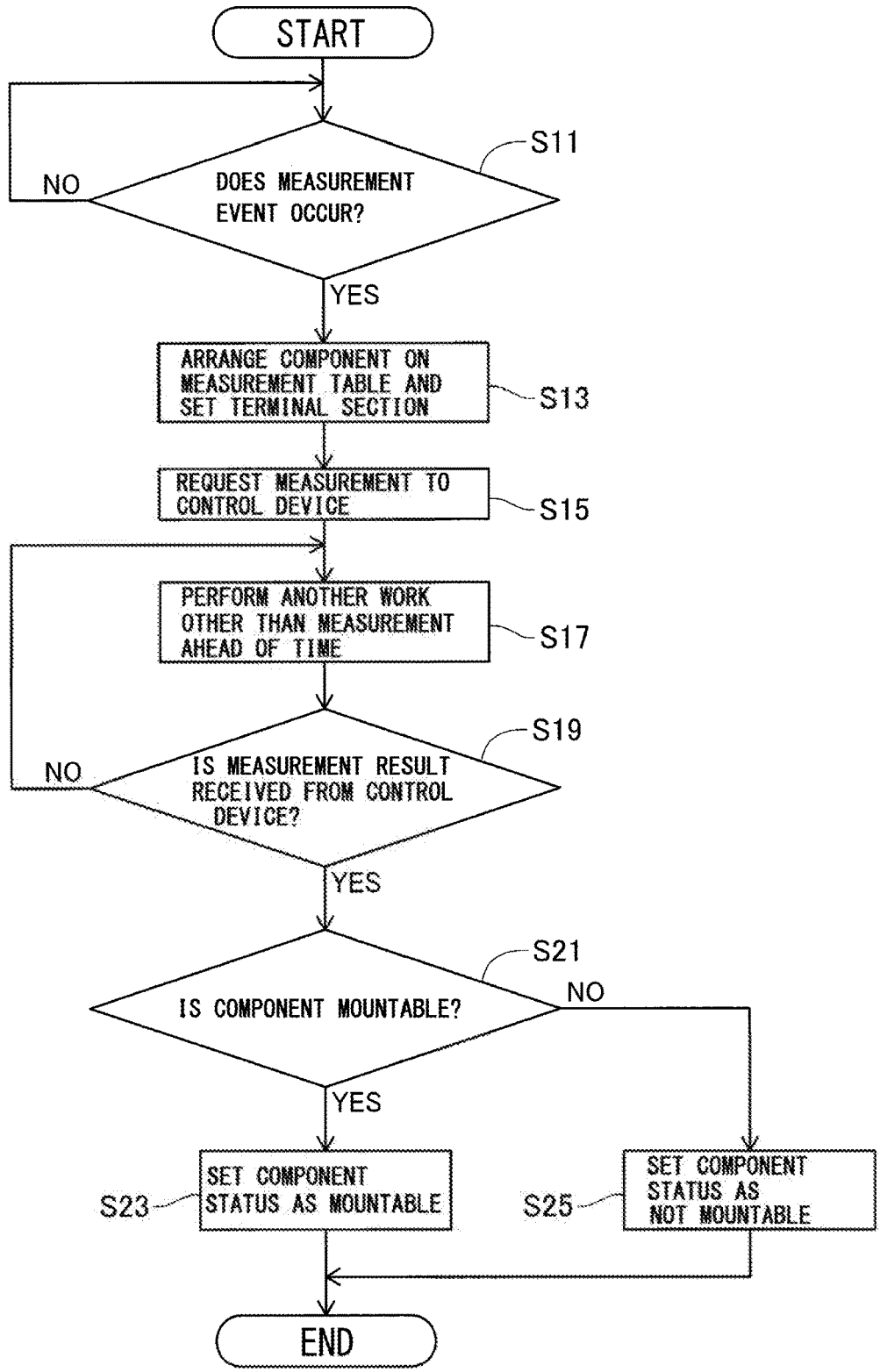
FIG. 7 is a flowchart showing an operation of the mounting machine when measuring electrical characteristics of an electronic component.

In addition, for example, the controller 122 attaches the information on the number of mounting points of the electronic component 140 as the measurement target to the request information D1 and transmits the information to the control device 13 in S15 of FIG. 7. The control device 13 preferentially processes the request information D1 with a larger number of mounting points based on the information on the number of mounting points attached to the request information D1 (an example of relevant information). Thus, it is possible to shorten the stop time and the delay time of the mounting work caused by the measurement processing as much as possible by preferentially measuring the electronic component 140 having a large number of mounting points.

Effect 5

Until the characteristic measurement value D2 is received from the measurement device 14 (S19 in FIG. 7: NO), the controller 122 performs a work of mounting another electronic component 140 different from the electronic component 140 as the measurement target on the circuit board CB (S17). In this way, it is possible to shorten the mounting time required to mount all the electronic components 140 on the circuit board CB, as compared with the case where the mounting is stopped until the characteristic measurement value D2 is received, thereby improving the manufacturing efficiency.

Effect 6

The controller 122 transmits the request information D1 toward the control device 13 via the network NW (S11 in FIG. 7: YES) in accordance with the timing at which it is necessary to measure the electronic component 140, such as the timing of replenishing the electronic component 140 (S15). In this way, it is possible to optimize the measurement timing, that is, the timing of using the measurement device 14, reduce the frequency of use of the measurement device 14 as much as possible, and supply the measurement device 14 with more mounting machines 16.

The present disclosure is not limited to the above-described embodiment, and it goes without saying that various improvements and modifications can be made without departing from the spirit of the present disclosure. For example, in the above-described embodiment, the unique value D3 is stored in the memory section 157 of the control device 13, but the present disclosure is not limited to this configuration, and for example, the unique value D3 required by each of the mounting machines 16 may be stored in a memory or the like. In addition, in the above embodiment, the measurement value is corrected by using the unique value D3 corresponding to each measurement path, but the same correction value may be used for multiple measurement paths or correction may not be performed.

In addition, in the above-described embodiment, the control device 13 automatically measures and stores the unique value D3, but the present disclosure is not limited thereto and the user may manually measure the unique value D3. In addition, in the above embodiment, the control device 13 performs priority processing according to the number of mounting points and the like for the multiple pieces of request information D1, but the present disclosure is not limited thereto and the priority processing may not be performed. For example, the control device 13 may sequentially process from the previously received request information D1. In addition, in the embodiment described above, the mounting machine 16 preferentially performs another work until the characteristic measurement value D2 is received, but the present disclosure is not limited thereto and may wait until the characteristic measurement value D2 is received. In addition, in the above embodiment, the timing of transmitting the request information D1 from the mounting machine 16 to the control device 13 is an example, and the request information D1 may be transmitted at another timing. In addition, the configuration or connection of the device in the above embodiment is merely an example and may be changed as appropriate. For example, in the above embodiment, the control device 13 or the switching device 12 is provided as separate devices from the measurement device 14, but one of the control device 13 and the switching device 12 may consist of the measurement device 14 as one device. Alternatively, the control device 13, the switching device 12 and the measurement device 14 may consist of one device.

REFERENCE SIGNS LIST

10: mounting system, 12: switching device, 13: control device, 14: measurement device, 16: mounting machine, 110: measurement unit, 140: electronic component, 157: memory section, CB: circuit board, D1: request information

The invention claimed is:

1. A mounting system comprising:
multiple mounting machines that mounts electronic components on a circuit board;
a measurement section that is provided in each of the multiple mounting machines;
a measurement device that measures electrical characteristics of the electronic component connected to the measurement section;
a switching device that connects the measurement device to the measurement section provided in any one of the multiple mounting machines; and
a control device that controls the switching device to switch connection between the measurement device and the measurement section,
wherein, in a case where the control device receives the request information for measuring the electronic component from at least one of the multiple mounting machines, the control device controls the switching device to connect the measurement section of the mounting machine that transmitted the request information to the measurement device and then performs measurement by performing measurement processing.

2. The mounting system according to claim 1, further comprising:
a storage device that stores a correction value for correcting a measurement error according to the electrical characteristics in a measurement path connecting the measurement device and the measurement section provided in any one of the multiple mounting machines,
wherein the control device performs correction value setting processing of reading the correction value corresponding to the measurement path used for measurement from the storage device and setting the correction value in the measurement device when performing the measurement processing.

3. The mounting system according to claim 2,
wherein the control device performs
correction value measurement processing of measuring the correction value by the measurement device in a state where the electronic component is not connected to the measurement section,
correction value storing processing of storing the measured correction value in the storage device,
measurement path switching processing of switching the measurement path by controlling the switching device, and
completion determination processing of determining whether the correction value measurement processing is completed for all the measurement paths corresponding to each of the multiple mounting machines.

4. The mounting system according to claim 1,
wherein the multiple mounting machines transmit relevant information related to a mounting work in each mounting machine to the control device, the relevant information being transmitted in association with the request information, and
wherein the control device includes a buffer section that stores the request information and the relevant information and performs priority setting processing of setting priorities to the multiple pieces of request information based on the relevant information in a case where the plurality pieces of the request information are stored in the buffer section.

5. The mounting system according to claim 1,
wherein at least one of the multiple mounting machines performs
reception determination processing of determining whether a characteristic measurement value obtained by measuring the electrical characteristics of the electronic component by the measurement device is received, and
mounting priority processing of preferentially mounting an electronic component different from the measurement target electronic component on the circuit board in a case where the characteristic measurement value is not received.

6. The mounting system according to claim 1,
wherein each of the multiple mounting machines performs request information transmission processing of transmitting the request information to the control device in response to at least one of power-on, replenishing of the electronic component, and replacing of the electronic component.

* * * * *